(12) United States Patent
Uenoyama

(10) Patent No.: US 6,366,079 B1
(45) Date of Patent: Apr. 2, 2002

(54) ROTATION DETECTOR HAVING TWO PAIRS OF SYMMETRICALLY POSITIONED MAGNETORESISTIVE ELEMENT CIRCUITS

(75) Inventor: Hirofumi Uenoyama, Nishikasugai-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/699,557

(22) Filed: Oct. 31, 2000

(30) Foreign Application Priority Data

Nov. 25, 1999 (JP) .......................................... 11-334467

(51) Int. Cl.$^7$ ............................. G01B 7/30; G01R 33/09
(52) U.S. Cl. ............................ 324/207.21; 324/207.25; 338/32 R
(58) Field of Search ................... 324/207.21, 207.25, 324/207.24, 174, 235, 252; 338/32 R

(56) References Cited

U.S. PATENT DOCUMENTS 5,621,320 A * 4/1997 Yokotani et al. ............ 324/252
5,656,936 A * 8/1997 Ao et al. ................ 324/207.21

FOREIGN PATENT DOCUMENTS

| JP | 6-224488 | 8/1994 |
| JP | 11-237256 | 8/1999 |

OTHER PUBLICATIONS

U.S. application No. 09/198,567, Nakatani et al., filed Nov. 23, 1998, (corresponds to JP 11-237256).

* cited by examiner

Primary Examiner—Jay Patidar
Assistant Examiner—Reena Aurora
(74) Attorney, Agent, or Firm—Law Office of David G. Posz

(57) ABSTRACT

Rotation of a rotating object such as a toothed rotor is detected based on put potentials of a bridge circuit having four magnetoresistive elements. The bridge circuit formed on an integrated circuit chip is positioned in a biasing magnetic field generated by a magnet disposed at a vicinity of the toothed rotor. A pair of magnetoresistive elements form a first circuit in the bridge while the others pairs forms a second circuit. To cancel influence of magnetostrictive effects due to an external force imposed on the integrated circuit chip, the first and second circuits in the bridge are positioned symmetrically to each other with respect to a center line of the biasing magnetic field.

6 Claims, 4 Drawing Sheets

PRIOR ART

ROTATION DETECTOR HAVING TWO PAIRS OF SYMMETRICALLY POSITIONED MAGNETORESISTIVE ELEMENT CIRCUITS

CROSS-REFERENCE TO RELATED APPLICATION

This application is based upon and claims benefit of priority of Japanese Patent Application No. Hei-11-334467 filed on Nov. 25, 1999, the content of which is incorporated herein by reference.

BACKGROUND OF THE INVENTION

1. Field of the Invention

The present invention relates to a rotation detector that detects an angular position or a rotational speed of a rotating object, the rotation detector using magnetoresistive elements that change their electrical resistance in response to changes in a magnetic field vector. The rotation detector is suitable for use in an engine control and an anti-block braking system in an automobile vehicle.

2. Description of Related Art

It is generally known to use a bridge circuit having magnetoresistive elements in detecting rotation of a rotating object such as a toothed rotor. The magnetoresistive element (hereinafter referred to as MRE) changes its electrical resistance in response to changes in a biasing magnetic field caused by rotation of a toothed rotor. A pair of MRE circuits are positioned at both sides of a center of a biasing magnetic field. An MRE bridge composed of the pair of MRE circuits detects a rotational position of the toothed rotor.

An integrated circuit chip (herein after referred to as an IC-chip) having an MRE bridge is usually mounted on a copper reed frame and molded with thermosetting resin such as epoxy resin. The molding die is heated to a level of 150–160° C. and molten resin at about 175° C. is injected into the die to mold the IC chip. A stress is generated inside the IC-chip by the heat in the molding process. That is, an expansion stress is imposed on the IC-chip because the expansion coefficient of the copper reed frame is much higher than that of the IC-chip (made of silicon). Then, the IC-chip molded together with the copper reed frame is cooled down to a room temperature, and a shrinkage stress is given to the IC-chip by shrinkage of the copper frame and molding resin.

Further, the rotation detector is subjected to temperature changes when it is actually used in an automobile, for example. The molding resin expands or shrinks according to the temperature changes. When the temperature rises, for example, the stress imposed on the IC-chip tends to be reduced because the temperature becomes closer to the molding temperature.

Such temperature changes adversely affect the MRE bridge formed in the IC-chip due to magnetostrictive effects caused by a stress imposed on a ferromagnetic thin film such as an MRE. The magnetostrictive effects include changes of magnetic properties such as magnetic field saturation and a resistance-change-ratio in the MRE. The magnetostrictive effects are not uniformly given to both MRE circuits composing the MRE bridge in the conventional rotation detector. Therefore, output voltages of both MRE circuits are differently affected by the magnetostrictive effects, and accordingly, rotation of the toothed rotor cannot be accurately detected.

SUMMARY OF THE INVENTION

The present invention has been made in view of the above-mentioned problem, and an object of the present invention is to provide an improved rotation detector that accurately detects rotation of a rotating object by eliminating the adverse effects of the magnetostriction.

The rotation detector is composed of a biasing magnet for generating a biasing magnetic field and an MRE bridge formed on an IC-chip. The rotation detector is positioned to face a rotating object such as a toothed rotor with a certain air gap. The MRE bridge includes a first MRE circuit and a second MRE circuit, each circuit having a pair of MREs connected in series between a power source and a ground. The biasing magnet is positioned so that its magnetic field center line coincides with a diameter of the toothed rotor, and the first and second MRE circuits are positioned symmetrically to each other with respect to the magnetic field center line. Electrical resistance of each MRE changes in response to changes in the biasing magnetic field caused by rotation of the toothed rotor. Rotation of the rotor is detected based on output potentials of the MRE bridge.

The resistance of each MRE is influenced by magnetostrictive effects due to external force imposed on the IC-chip on which the MRE is patterned. Such external force is generated by temperature changes or other causes. Since the first and second MRE circuits in the MRE bridge are positioned symmetrically to each other with respect to the biasing magnetic field center line, the influence of the magnetostrictive effects is canceled in the MRE bridge as a whole.

The four MREs in the MRE bridge can be variously patterned, as long as the influence of the magnetostrictive effects is equally given to the first and second MRE circuits, and the influence is canceled in the MRE bridge as a whole. The MREs connected to the power source in both the first and second MRE circuits are positioned symmetrically to each other with respect to the magnetic field center line, and the grounded MREs in both circuits are also symmetrically positioned. A power source side MRE in the first MRE circuit and a grounded MRE in the second MRE circuit may be patterned at one side of the magnetic field center, while a power source side MRE in the second MRE circuit and a grounded MRE in the first MRE circuit may be patterned at the other side of the magnetic field center. Each of the four MREs may be divided into two equal portions, and the power source side MRE and the grounded MRE in both the first and second MRE circuits may be patterned in an X-shape, respectively. It is necessary to select directions of MRE patterning in any arrangement, so that two output potentials of the MRE bridge change with a phase difference therebetween in response to the biasing magnetic field changes.

Since an adverse influence of the magnetostrictive effects on the MRE bridge is canceled as a whole according to the present invention, rotation of the rotating object is precisely detected without being affected by temperature changes or other external disturbances.

Other objects and features of the present invention will become more readily apparent from a better understanding of the preferred embodiments described below with reference to the following drawings.

DETAILED DESCRIPTION OF THE PREFERRED EMBODIMENTS

A first embodiment of the present invention will be described with reference to FIGS. 1, 2A and 2B. The rotation detector according to the present invention is used for detecting a rotational angle or a rotational speed of a rotating object such as a toothed rotor. The rotation detector is used as a sensor for detecting, for example, engine rotation, cam angle, crank shaft angle, vehicle speed, wheel speed and so on.

Figure 1:
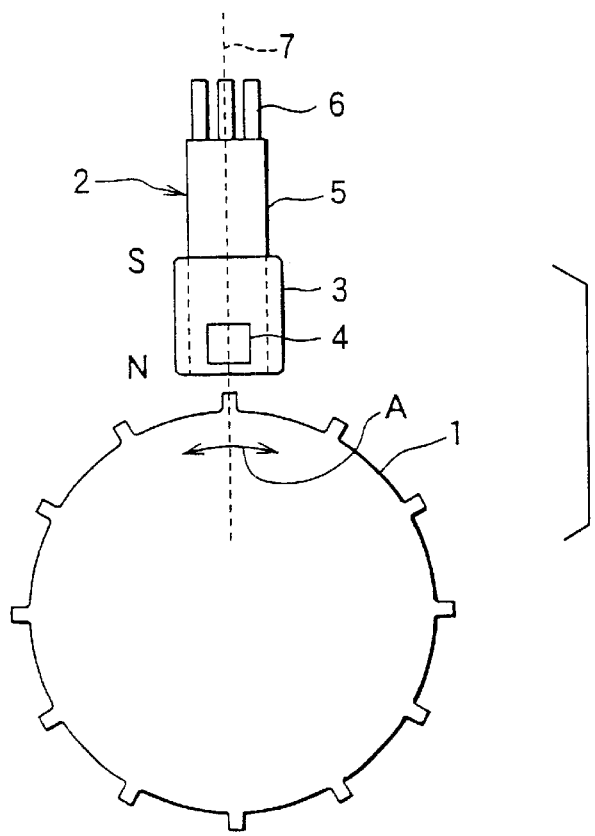
FIG. 1 is a plan view showing a rotation detector positioned to face a toothed rotor.

Referring to FIG. 1, an entire structure of the rotation detector will be described. The rotation detector 2 is positioned to face a rotating toothed rotor 1 with a certain air gap therebetween. The rotation detector 2 is composed of a biasing magnet 3 and an IC-chip 4 mounted on a copper reed frame 6. The IC-chip 4 and the reed frame 6 are molded together with a thermosetting molding material 5 such as epoxy resin. The biasing magnet 3 is positioned so that a center line 7 of a biasing magnetic field generated by the biasing magnet 3 extends toward a rotational center of the toothed rotor 1. The IC-chip 4 in the molding material 5 is positioned to face the toothed rotor 1, and the reed frame 6 extends from the other side of the molding material 5. After the IC-chip 4 and the reed frame 6 are molded, a hollow biasing magnet 3 is mounted on the molding material 5.

The biasing magnet 3 is magnetized so that an N-pole faces the toothed rotor 1 and an S-pole appears at the other side. The biasing magnetic field changes according to rotation of the toothed rotor 1, i.e., according to whether the center line 7 coincides with a tooth of the toothed rotor 1. The changes of the biasing magnetic field are detected by an MRE bridge formed on the IC-chip 4.

Figure 2A:
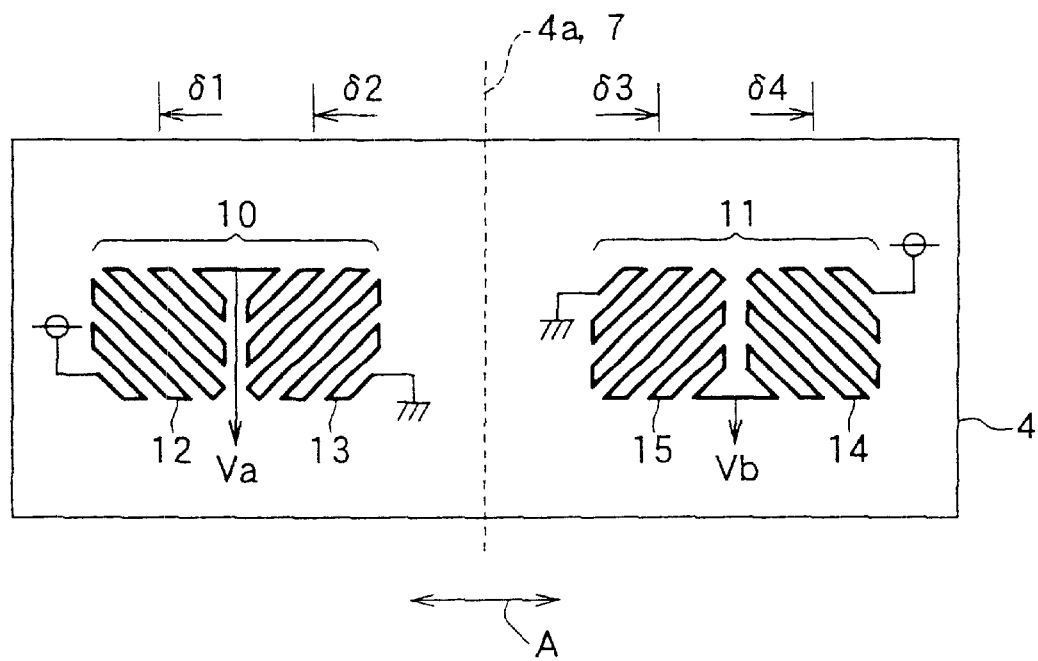
FIG. 2A is a plan view showing a pattern of an MRE bridge circuit as a first embodiment of the present invention.

The MRE bridge formed on the IC-chip 4 is shown in FIG. 2A in an enlarged scale. The MRE bridge is composed of a first MRE circuit 10 and a second MRE circuit 11. The center line 4a of the IC-chip 4 coincides with the center line 7 of the biasing magnetic field. The first MRE circuit 10 and the second MRE circuit 11 are positioned symmetrically with respect to the center line 4a. The first MRE circuit 10 includes a first MRE 12 and a second MRE 13, and the second MRE circuit 11 includes a third MRE 14 and a fourth MRE 15. Each MRE is comb-shaped, forming plural long sides and short sides alternately. Each MRE is a ferromagnetic magnetoresistive element made of a nickel-based alloy such as Ni—Co or Ni—Fe. A thin film of such an alloy is formed on the IC-chip 4 by a known process such as vapor deposition, and then the thin film is patterned and etched into a desired form by a photolithography process.

The first MRE 12 and the second MRE 13 of the first MRE circuit 10 are connected in series and aligned along the rotational direction A of the toothed rotor 1. The first MRE 12 is patterned in the direction that makes about 45° with respect to the center line 7 of the biasing magnetic field. The second MRE 13 is patterned in the direction substantially perpendicular to the direction of the first MRE 12. In other words, both MREs 12 and 13 are patterned to form a V-shape. In this manner, waveform deformation in an output voltage of the MREs 12, 13 is avoided even when the changes of the biasing magnetic field is large.

The third and fourth MREs 14, 15 of the second MRE circuit 11 are similarly patterned, so the first and second MRE circuits 10 and 11 are positioned symmetrically to each other with respect to the center line 7 of the biasing magnetic field. That is, the third MRE 14 is patterned in the same direction as the first MRE 12 and positioned symmetrically thereto with respect to the center line 4a. The fourth MRE 15 is patterned in the same direction as the second MRE 13 and positioned symmetrically thereto with respect to the center line 4a. Both MREs 14 and 15 of the second MRE circuit 11 form another V-shape which is upside-down relative to the V-shape formed by MREs 12 and 13 of the first MRE circuit 10.

Figure 2B:
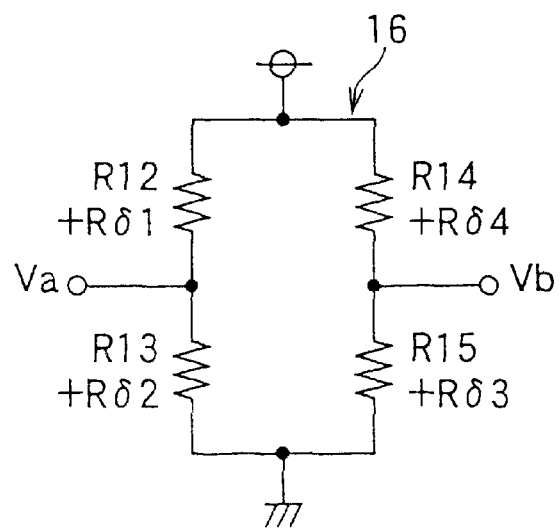
FIG. 2B is a circuit diagram showing the MRE bridge circuit shown in FIG. 2A.

The MRE bridge 16 composed of the first and second MRE circuit 10, 11 is electrically connected as shown in FIG. 2B. In the first MRE circuit 10, the first and second MREs 12, 13 are connected in series, and the first MRE 12 is connected to a power source while the second MRE 13 is grounded. Similarly, in the second MRE circuit 11, the third and fourth MREs 14, 15 are connected in series, and the third MRE 14 is connected to the power source while the fourth MRE 15 is grounded. An output potential Va is taken out from a junction of the first and second MREs 12, 13 in the first MRE circuit 10, while an output potential Vb is taken out from a junction of the third and fourth MREs 14, 15 in the second MRE circuit 11.

Operation of the rotation detector 2 will be described below. As the toothed rotor 1 rotates in the direction "A", teeth and ditches of the toothed rotor 1 alternately face the biasing magnet 3. When a tooth approaches the biasing magnet 3, the biasing magnetic field changes, being pulled by the tooth. At this time, a magnetic vector passing through the MREs 12–14 swings in the rotational direction "A". The resistance of the MREs changes in response to the direction changes of the magnetic vector. Accordingly, the output potentials Va and Vb of the MRE bridge 16 change in response to the rotation of the toothed rotor 1. The output potentials Va, Vb are input to a differential amplifier (not shown). The rotation of the toothed rotor 1 is detected based on the output of the differential amplifier. Since the pair of MRE circuits 10, 11 are positioned symmetrically with respect to the center line 7 of the biasing magnetic field, there is a phase difference between two output potentials Va and Vb. Therefore, the position of the rotor tooth is detected even when the rotor 1 does not rotate.

Influence of the magnetostrictive effects on the MRE bridge 16 will be explained below. The IC-chip 4 is molded with the molding material 5, as described above, and therefore, external force due to temperature changes or other causes is imposed on the IC-chip 4, and the magnetostriction is generated in the MRE bridge 16. More particularly, stress $\delta 1$, $\delta 2$, $\delta 3$ and 64 are imposed on the first, second, third and fourth MREs 12–15, respectively, as shown in FIG. 2A. Due to the imposed stress, the resistance of the respective MREs 12–15 varies by $R\delta 1$, $R\delta 2$, $R\delta 3$ and $R\delta 4$, respectively, as shown in FIG. 2B. The output potential Va of the first MRE circuit 10 is expressed as follows:

$$Va=(R12+R\delta 1)\cdot E/(R12+R\delta 1+R13+R\delta 2),$$

where R12, R13 are resistances of the first and second MREs 12, 13, respectively, and E is a power source voltage. The output potential Vb of the second MRE circuit 11 is expressed as follows:

$$Vb=(R14+R\delta 4)\cdot E/(R14+R\delta 4+R15+R\delta 3),$$

where R14, R15 are resistances of the third and fourth MREs 14, 15, respectively.

The stress $\delta 1, \delta 4$ imposed on the MREs 12, 14 positioned outside is larger than the stress $\delta 2, \delta 3$ imposed on the MREs 13, 15 positioned inside. Since the MREs 12, 14 are symmetrically positioned with respect to the center line 4a, $\delta 1$ is substantially equal to $\delta 4$. Similarly, since the MREs 13, 15 are symmetrically positioned with respect to the center line 4a, $\delta 2$ is substantially equal to $\delta 3$. Therefore, there is a following relation among the resistance changes caused by the stress:

$$(R\delta 1=R\delta 4)>(R\delta 2=R\delta 3)$$

Assuming R12=R13=R14=R15, Va becomes equal to Vb (Va=Vb). In this manner, the magnetostrictive effects are equally given to both the first MRE circuit 10 and the second MRE circuit 11. In other words, the adverse influence of the magnetostriction is eliminated in the MRE bridge 16 as a whole, and accordingly, rotation of the toothed rotor 1 is accurately detected.

Figure 3:
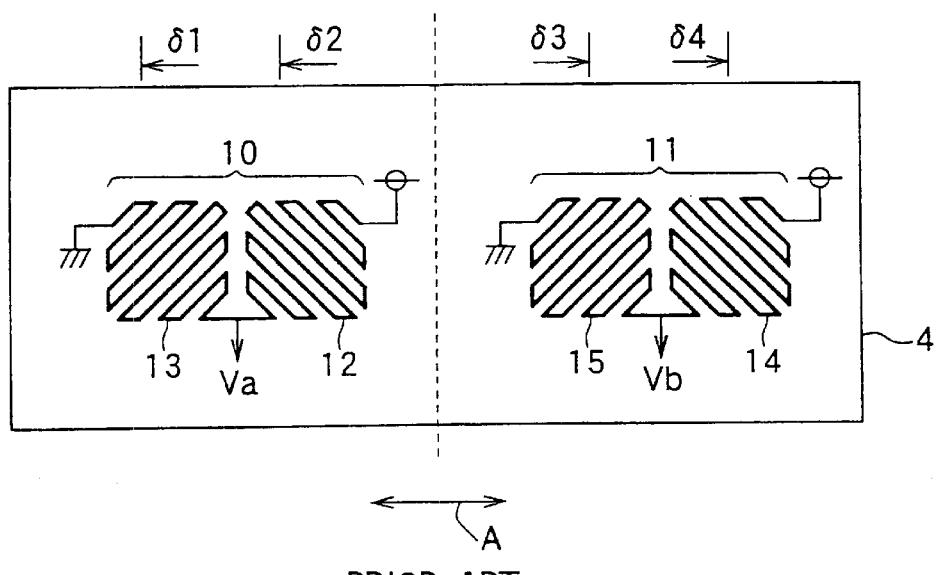
FIG. 3 is a plan view showing a pattern of an MRE bridge circuit as a comparative example.

FIG. 3 shows an MRE bridge pattern as a comparative example, in which the first MRE 12 and the third MRE 14 both connected to the power source are not symmetrically positioned with respect to the biasing magnetic field center 7. Similarly, the second MRE 13 and the fourth MRE 15 both grounded are not positioned symmetrically with respect to the biasing magnetic field center. In this structure, the stress is unequally imposed on the first MRE circuit 10 and the second MRE circuit 12. Therefore, the adverse effects of magnetostriction cannot be eliminated, and accordingly, rotation of the rotating object is not detected with accuracy.

In the MRE bridge 16 shown in FIG. 2A, the first MRE 12 and the third MRE 14 are patterned in the same direction, and the second MRE 13 and the fourth MRE 15 are patterned in the same direction which is different from the former. Therefore, when the MRE bridge 16 is connected as shown in FIG. 2B, the output potentials Va and Vb vary with a phase difference therebetween in response to rotation of the toothed rotor 1. Thus, the rotation is detected based on the output of the differential amplifier to which Va and Vb are input. If MREs 12 and 14 are patterned in different directions to each other and MREs 13 and 15 are patterned in different directions to each other, Va and Vb vary in phase, no rotational information is obtained from the output of the differential amplifier.

Figure 4A:
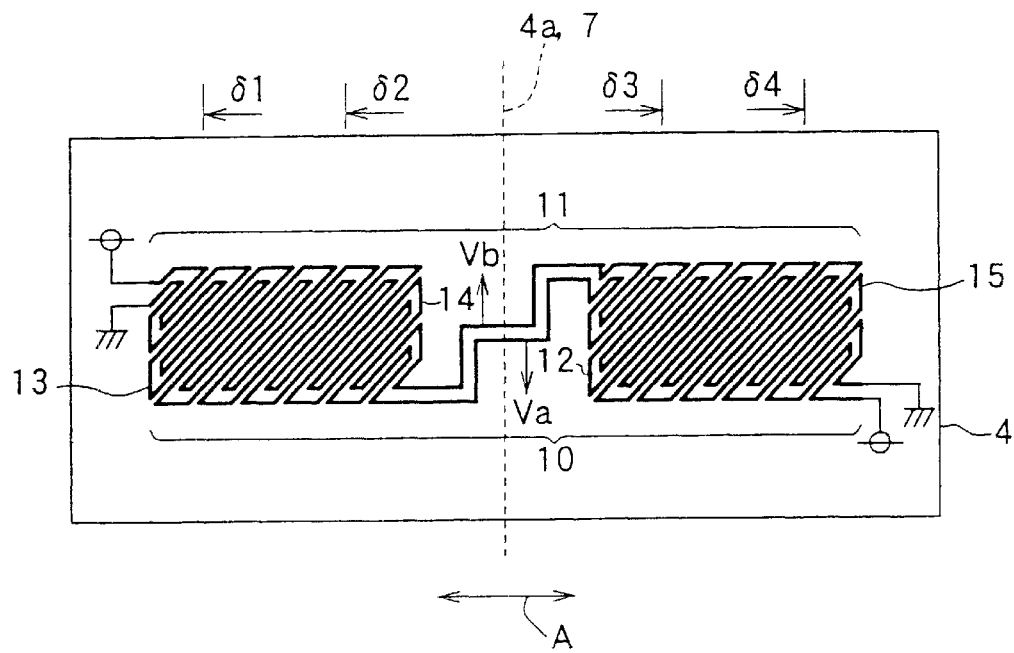
FIG. 4A is a plan view showing a pattern of an MRE bridge circuit as a second embodiment of the present invention.
Figure 4B:
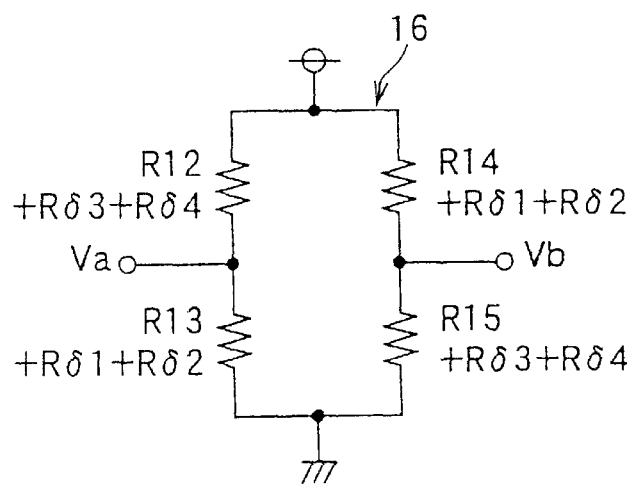
FIG. 4B is a circuit diagram showing the MRE bridge circuit shown in FIG. 4A.

A second embodiment of the present invention will be described with reference to FIGS. 4A and 4B. In this embodiment, the MRE bridge 16 is patterned differently from that of the first embodiment, but the adverse influence of the magnetostrictive effects is eliminated in the similar manner.

The first MRE circuit 10 composed of the first and second MREs 12, 13, and the second MRE circuit 11 composed of the third and fourth MREs 14, 15 are positioned symmetrically with respect to the biasing magnetic field center line 7. All the MREs 12–15 are patterned in the same direction about 450 inclined from the center line 7. The MREs 12–15 are connected to form the MRE bridge 16, as shown in FIG. 4B. The first MRE 12 and the fourth MRE 15 are patterned on the same side of the center line 4a (right side in FIG. 4A) and arranged in a comb-shape not to contact each other. Similarly, the second MRE 13 and the third MRE 14 are patterned on the other side of the center line 4a (left side in FIG. 4A) and arranged in a comb-shape not to contact each other.

The influence of the magnetostrictive effects on the MRE bridge 16 will be explained below. The stress $\delta 3, \delta 4$ due to the external force is equally imposed on the MREs 12 and 15 formed on the IC-chip 4, and stress $\delta 1, \delta 2$ is equally imposed on the MREs 13 and 14, as shown in FIG. 4A. The resistance of the MREs 12, 15 is changed by $(R\delta 3+R\delta 4)$ due to the magnetostriction caused by the stress, while the resistance of the MREs 13, 14 is changed by $(R\delta 1+R\delta 2)$. The output potentials Va and Vb of the MRE bridge 16 are expressed in the following formulae, respectively:

$$Va=(R12+R\delta 3+R\delta 4)\cdot E/(R12+R\delta 3+R\delta 4+R13+R\delta 1+R\delta 2), \text{ and}$$

$$Vb=(R14+R\delta 1+R\delta 2)\cdot E/(R14+R\delta 1+R\delta 2+R15+R\delta 3+R\delta 4),$$

where R12, R13, R14 and R15 are resistances of MREs 12, 13, 14 and 15, respectively, and E is a power source voltage.

Since a pair of the MREs 12, 15 and the other pair 13, 14 are patterned symmetrically with respect to the center line 4a, the stress $(\delta 3+\delta 4)$ imposed on the MREs 12, 15 is equal to the stress $(\delta 1+\delta 2)$ imposed on the MREs 13, 14. Accordingly, the resistance changes in both pairs are also equal, that is:

$$(R\delta 1+R\delta 2)=(R\delta 3+R\delta 4)$$

Assuming R12=R13=R14=R15, both output potentials Va and Vb are equal to each other (Va=Vb). This means that the influence of the magnetostrictive effects is equally given to both the first MRE circuit 10 and the second MRE circuit 11. Therefore, the adverse influence on the MRE bridge 16 is canceled as a whole, and accordingly, rotation of the toothed rotor 1 is accurately detected.

If the first MRE 12 and the third MRE 14 are patterned in the different directions to each other with respect to the biasing magnetic field center line 7, and the second MRE 13 and the fourth MRE 15 are patterned in the different directions, both output potentials Va and Vb change in phase and no rotational information is obtained. Since those pairs of the MREs, i.e., 12 and 14; and 13 and 15 are patterned in the same direction in this embodiment, the output potentials Va and Vb change with a phase difference therebetween in response to rotation of the toothed rotor 1, and accordingly, the output from the differential amplifier correctly represents the rotational information.

Figure 5A:
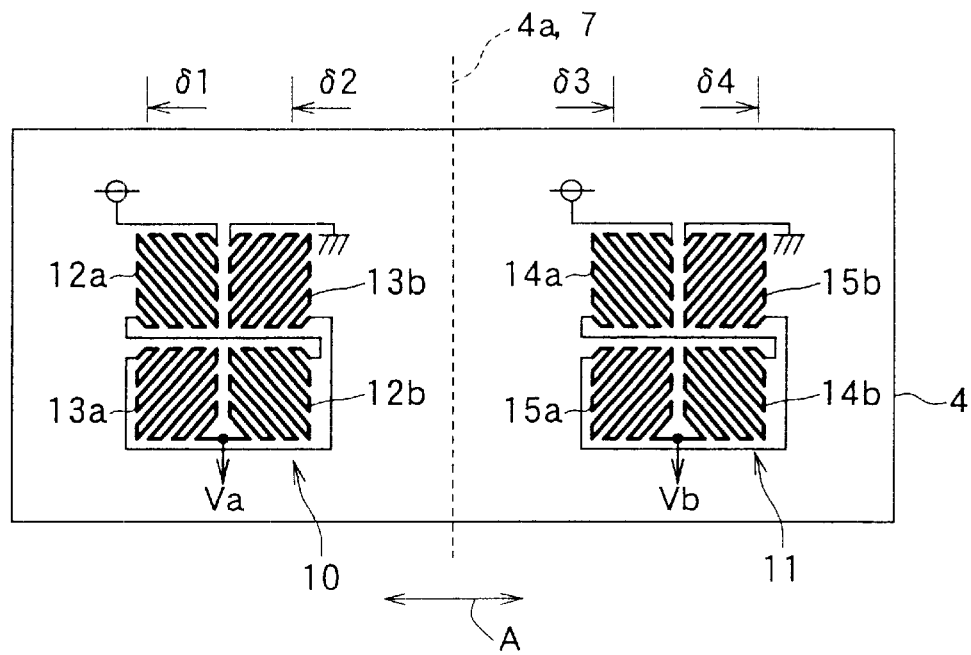
FIG. 5A is a plan view showing an MRE bridge circuit as a third embodiment of the present invention.

A third embodiment of the present invention will be described with reference to FIGS. 5A and 5B. This embodiment is similar to the first embodiment, except that each MRE 12–15 is equally divided into two portions. Therefore, only the features of the third embodiment different from those of the first embodiment will be described below.

The first MRE circuit 10 is composed of the first and second MREs 12, 13, and the second MRE circuit 11 is composed of the third MRE 14 and the fourth MRE 15, in the same manner as in the first embodiment. The first MRE 12 is divided into two equal portions 12a and 12b, and the second MRE 13 is divided into two equal portions 13a and 13b. Those four divided MREs are patterned as shown in FIG. SA. The pattern direction of MREs 12a, 12b and that of MREs 13a and 13b cross each other in an X-shape. Similarly, the third MRE 14 is divided into 14a and 14b, and the fourth MRE 15 is divided into 15a and 15b. Those divided portions are patterned as shown in FIG. SA. The pattern direction of MREs 14a, 14b crosses the pattern direction of MREs 15a, 15b in an X-shape.

Figure 5B:
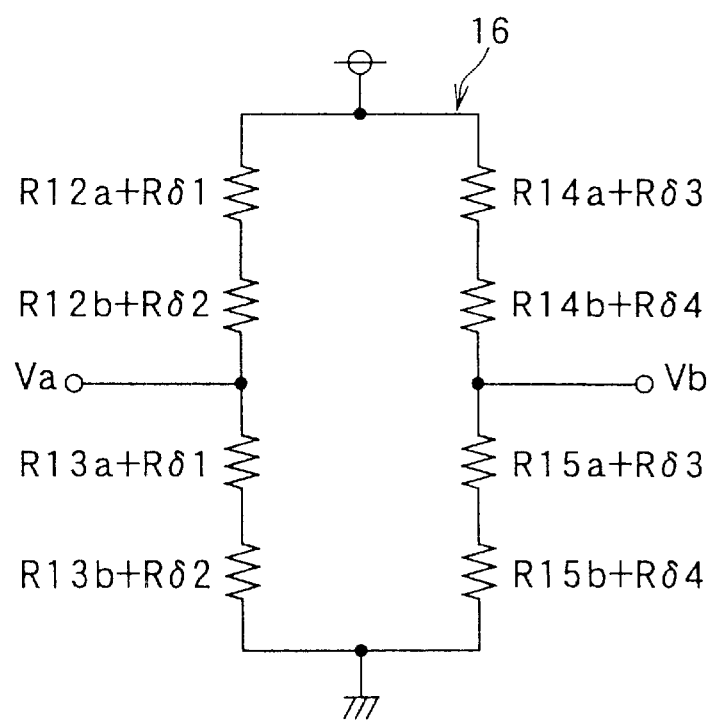
FIG. 5B is a circuit diagram showing the MRE bridge circuit shown in FIG. 5A.

All the divided MREs are connected as shown in FIG. 5B, forming an MRE bridge 16. The first MRE circuit 10 in the bridge 16 is composed of MREs 12a, 12b, 13a and 13b, all connected in series between the power source and the ground. Similarly, the second MRE circuit is composed of MREs 14a, 14b, 15a and 15b, all connected in series between the power source and the ground.

The influence of magnetostrictive effects on the MRE bridge 16 will be explained. The stress δ1, δ2, δ3, δ4 are imposed on the MREs 12a–15b in the similar manner as in the first embodiment, as shown in FIG. SA. Due to the imposed stress, resistances of MREs 12a–15b change to (R12a+Rδ1), (R12b+Rδ2), (R13a+Rδ1), (R13b+Rδ2), (R14a+Rδ3), (R14b+Rδ4), (R15a+Rδ3) and (R15b+Rδ4), respectively.

The output potentials Va and Vb of the MRE bridge 16 are expressed as follows:

Va=(R12a+Rδ1+R12b+Rδ2)·E/(R12a+Rδ1+R12b+Rδ2+R13a+Rδ1+R13b+Rδ2)

Vb=(R14a+Rδ3+R14b+Rδ4)·E/(R14a+Rδ3+R14b+Rδ4+R15a+Rδ3+R15b+Rδ4)

For the same reason as in the first embodiment, the resistance changes are expressed as follows:

(Rδ1=Rδ4)>(Rδ2=Rδ3)

Assuming the resistances R12a–R15b are all equal, Va becomes equal to Vb.

Thus, the adverse influence of the magnetostriction on the MRE bridge 16 is eliminated as a whole. In addition, influence of stress δ1, δ2 on the output potential Va can be kept constant in this embodiment. Similarly, influence of stress δ3, δ4 on the output potential Vb can be kept constant. In other words, the influence of the stress on the first MRE circuit 10 and the second MRE circuit 11 is individually adjusted in itself. Therefore, even if the each stress δ1–δ4 is different from one another, the adverse influence can be eliminated in this embodiment thereby to detect the rotational information with accuracy. Further, since each pair of divided MREs (for example, 12a and 12b) is patterned so that one divided portion shifts from the other divided portion along the biasing magnetic field center line 7, the influence of the magnetostriction along the center line 7 can be eliminated, in addition to elimination of the influence along the rotational direction "A".

Though each MRE is divided into two portions in the third embodiment, it is also possible to divide it into more than two portions. For example, each MRE 12–15 may be divided into four portions to form 16 portions, and they may be patterned symmetrically with respect to the biasing magnetic field center line 7.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A rotation detector comprising:

a biasing magnet, positioned to face a toothed rotor with a air gap therebetween, for generating a biasing magnetic field; and an MRE bridge patterned on an IC-chip and positioned in the biasing magnetic field to face the toothed rotor with a air gap therebetween, the MRE bridge including a first MRE circuit and a second MRE circuit, the first MRE circuit having a first MRE and a second MRE connected in series in this order between a power source and a ground, the second MRE circuit having a third MRE and a fourth MRE connected in series in this order between the power source and the ground, resistances of the first MRE and the second MRE being changed with a phase difference therebetween in response to changes of the biasing magnetic field, resistances of the third MRE and the fourth MRE being changed with a phase difference therebetween in response to changes of the biasing magnetic field, the MRE bridge detecting rotation of the toothed rotor based on an output voltage thereof, wherein:

the first MRE in the first MRE circuit and the third MRE in the second MRE circuit are positioned symmetrically with respect to a center line of the biasing magnetic field; and the second MRE in the first MRE circuit and the fourth MRE in the second MRE circuit are positioned symmetrically with respect to the center line of the biasing magnetic field.

2. The rotation detector as in claim 1, wherein:

the first MRE and the third MRE are patterned in parallel to each other, making a predetermined slanted angle relative to the center line of the biasing magnetic field; and the second MRE and the fourth MRE are patterned in parallel to each other, making a predetermined slanted angle relative to the center line of the biasing magnetic field.

3. The rotation detector as in claim 2, wherein:

the first and second MREs in the first MRE circuit are patterned to form a V-shape having its center line parallel to the center line of the biasing magnetic field and having a predetermined angle between both sides of the V-shape; and the third and fourth MREs in the second MRE circuit are patterned to form a reversed V-shape having the same shape as the V-shape in the first MRE circuit and being turned by 180° with respect to a line perpendicular to the center line of the biasing magnetic field.

4. A rotation detector comprising:

a biasing magnet, positioned to face a toothed rotor with a air gap therebetween, for generating a biasing magnetic field; and an MRE bridge patterned on an IC-chip and positioned in the biasing magnetic field to face the toothed rotor with a air gap therebetween, the MRE bridge including a first MRE circuit and a second MRE circuit, the first MRE circuit having a first MRE and a second MRE connected in series in this order between a power source and a ground, the second MRE circuit having a third MRE and a fourth MRE connected in series in this order between the power source and the ground, resistances of the first MRE and the second MRE being changed with a phase difference therebetween in response to changes of the biasing magnetic field, resistances of the third MRE and the fourth MRE being changed with a phase difference therebetween in response to changes of the biasing magnetic field, the MRE bridge detecting rotation of the toothed rotor based on an output voltage thereof, wherein:

the first and fourth MREs are patterned in parallel to each other at one side of the center line of the biasing magnetic field with a predetermined slanted angle relative to the center line, forming a comb-shape in which the first and fourth MREs are interlaced not to contact each other;

the second and third MREs are patterned in parallel to each other at the other side of the center line of the biasing magnetic field with the same slanted angle as that of the first and fourth MREs, forming a comb-shape in which the second and third MREs are interlaced not to contact each other;

the first MRE in the first MRE circuit and the third MRE in the second MRE circuit are positioned symmetrically with respect to a center line of the biasing magnetic field; and the second MRE in the first MRE circuit and the fourth MRE in the second MRE circuit are positioned symmetrically with respect to the center line of the biasing magnetic field.

5. The rotation detector as in claim 4, wherein:

each MRE has a plurality of short sides and a plurality of long sides;

the short sides of the first and fourth MREs are patterned in parallel to one another, and the long sides thereof are patterned in parallel to one another; and the short sides of the second and third MREs are patterned in parallel to one another, and the long sides thereof are patterned in parallel to one another.

6. A rotation detector comprising:

a biasing magnet, positioned to face a toothed rotor with a air gap therebetween, for generating a biasing magnetic field; and an MRE bridge patterned on an IC-chip and positioned in the biasing magnetic field to face the toothed rotor with a air gap therebetween, the MRE bridge including a first MRE circuit and a second MRE circuit, the first MRE circuit having a first MRE and a second MRE connected in series in this order between a power source and a ground, the second MRE circuit having a third MRE and a fourth MRE connected in series in this order between the power source and the ground, the MRE bridge detecting rotation of the toothed rotor based on an output voltage thereof, wherein:

the first and second MRE circuits are positioned symmetrically with respect to a center line of the biasing magnetic field;

each MRE is divided into two equal portions;

the first and second MREs in the first MRE circuit are patterned in an X-shape crossing each other at a point equally dividing each MRE; and the third and fourth MREs in the second MRE circuit are patterned in the same X-shape as in the first MRE circuit crossing each other at a point equally dividing each MRE.

* * * * *